(12) United States Patent
Maruyama et al.

(10) Patent No.: US 9,877,397 B2
(45) Date of Patent: Jan. 23, 2018

(54) MOUNTING JIG FOR SEMICONDUCTOR DEVICE

(71) Applicant: FUJI ELECTRIC CO., LTD., Kawasaki-shi, Kanagawa (JP)

(72) Inventors: Rikihiro Maruyama, Matsumoto (JP); Kenshi Kai, Matsumoto (JP); Nobuyuki Kanzawa, Matsumoto (JP); Mitsutoshi Sawano, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/923,941

(22) Filed: Oct. 27, 2015

(65) Prior Publication Data

US 2016/0050764 A1 Feb. 18, 2016

Related U.S. Application Data

(62) Division of application No. 14/204,455, filed on Mar. 11, 2014, now Pat. No. 9,204,559.

(30) Foreign Application Priority Data

Mar. 22, 2013 (JP) .................................. 2013-060987

(51) Int. Cl.
*H05K 3/30* (2006.01)
*H01L 21/44* (2006.01)
(Continued)

(52) U.S. Cl.
CPC .......... *H05K 3/301* (2013.01); *H01L 21/4853* (2013.01); *H01L 23/49811* (2013.01);
(Continued)

(58) Field of Classification Search
CPC ....... H01L 2924/00; H01L 2224/48091; H01L 2924/1305; H01L 2924/13055; H01L 2924/00014; H01L 21/4853; H01L 2224/48137; H01L 23/3735; H01L 23/49811; H01L 25/072

See application file for complete search history.

(56) References Cited

U.S. PATENT DOCUMENTS 5,324,892 A * 6/1994 Granier ............... H05K 3/3426
174/250
5,548,372 A * 8/1996 Schroeder ................ G03F 9/00
355/53

(Continued)

FOREIGN PATENT DOCUMENTS

CN 101546741 A 9/2009
JP H05-102383 A 4/1993
(Continued)

OTHER PUBLICATIONS

Japan Patent Office, "Office Action for Japanese Patent Application No. 2013-060987," dated Nov. 1, 2016.
(Continued)

*Primary Examiner* — Minh Trinh
(74) *Attorney, Agent, or Firm* — Manabu Kanesaka

(57) ABSTRACT

A mounting jig for a semiconductor device includes an insulated circuit board positioning jig positioning an insulated circuit board by housing the insulated circuit board at a predetermined position, a tubular contact element positioning jig having a plurality of positioning holes at predetermined positions to insert a plurality of tubular contact elements respectively, and a tubular contact element press-down jig for pressing down the plurality of tubular contact elements inserted into the respective positioning holes in the tubular contact element positioning jig.

8 Claims, 11 Drawing Sheets

(51) Int. Cl.
*H05K 3/34* (2006.01)
*H01L 23/498* (2006.01)
*H01L 21/48* (2006.01)
*H01L 25/07* (2006.01)
*H05K 3/40* (2006.01)
*H01L 23/373* (2006.01)

(52) U.S. Cl.
CPC .......... *H01L 25/072* (2013.01); *H05K 3/303* (2013.01); *H05K 3/341* (2013.01); *H01L 23/3735* (2013.01); *H01L 2224/48091* (2013.01); *H01L 2224/48137* (2013.01); *H01L 2924/1305* (2013.01); *H01L 2924/13055* (2013.01); *H05K 3/4015* (2013.01); *H05K 2201/1031* (2013.01); *H05K 2201/10257* (2013.01); *H05K 2203/0278* (2013.01); *Y02P 70/611* (2015.11); *Y02P 70/613* (2015.11); *Y10T 29/41* (2015.01); *Y10T 29/532* (2015.01)

(56) References Cited

U.S. PATENT DOCUMENTS

| | | | |
|---|---|---|---|
| 6,346,433 B1 * | 2/2002 | Maeda | H01L 21/565 257/787 |
| 6,596,561 B2 * | 7/2003 | Takahashi | H01L 21/561 257/E21.504 |
| 8,087,943 B2 | 1/2012 | Stolze | |
| 9,204,559 B2 * | 12/2015 | Maruyama | H05K 3/301 |
| 2007/0039998 A1 | 2/2007 | Sato et al. | |
| 2009/0194884 A1 | 8/2009 | Stolze | |

FOREIGN PATENT DOCUMENTS

| | | |
|---|---|---|
| JP | H05-198724 A | 8/1993 |
| JP | H06-188355 A | 7/1994 |
| JP | 2002-374061 A | 12/2002 |
| JP | 2010-186953 A | 8/2010 |
| JP | 2010-283107 A | 12/2010 |
| JP | 2011-138998 A | 7/2011 |

OTHER PUBLICATIONS

Europe Patent Office, "Search Report for EP 14159319.4," dated Jan. 7, 2016.

China Patent Office, "Office Action for Chinese Patent Application No. 201410089723.3," dated Sep. 1, 2017.

* cited by examiner

MOUNTING JIG FOR SEMICONDUCTOR DEVICE

CROSS-REFERENCE TO RELATED APPLICATION

This is a divisional application of Ser. No. 14/204,455 filed on Mar. 11, 2014, which is based on, and claims priority to, Japanese Patent Application No. 2013-060987, filed on Mar. 22, 2013, contents of which are incorporated herein by reference.

BACKGROUND OF INVENTION

Field of the Invention

The present invention relates to a mounting jig for mounting tubular contact elements with high accuracy onto a semiconductor device provided with the tubular contact elements.

Background Art

A power semiconductor module of semiconductor devices is generally a device, wherein a semiconductor chip such as an IGBT contained in a case is mounted on an insulated circuit board, provided with external terminals for connecting the semiconductor chip and the exterior of the case. In recent years, a technology of connecting tubular contact elements to the circuit pattern of an insulated circuit board with solder has been proposed as the technology of easily and inexpensively connecting external terminals to the insulated circuit board with long term stability against mechanical stresses and vibrations (US 2009/0194884 A1). According to the technology, the tubular contact element is formed in a shape of a hollow cylindrical tube having a flange at each longitudinal end thereof, and one longitudinal end of the tubular contact element is soldered to the circuit pattern of the insulated circuit board so that the tubular contact element extends from the surface of the circuit pattern of the insulated circuit board with the longitudinal direction thereof being oriented in the vertical direction. By inserting an external terminal having a square cross section into the inner space of the tubular contact element to be press-fitted, it becomes possible to connect the external terminal to the tubular contact element with high reliability. With respect to a technology similar to that of using the tubular contact elements, a semiconductor device is disclosed in which the thickness of one end of a tubular electrode is made to be thinner than the thickness of the other end (JP-A-2011-138998).

Patent Document 1: US 2009/0194884 A1
Patent Document 2: JP-A-2011-138998

The external terminal of the semiconductor device provided with the tubular contact element is provided at a predetermined position. Therefore, in manufacturing the semiconductor device, the tubular contact element must be mounted on the insulated circuit board with high positioning accuracy. Poor positioning accuracy sometimes causes the tubular contact element to be mounted on the insulated circuit board inclined at some angle rather than vertical. The tubular contact element mounted at some angle will cause lack of solder inside the tube of the tubular contact element, which leads to possible reduction or instability in joining strength at the soldered joint.

Accordingly, the invention was made in view of such points with an object of providing a method of manufacturing a semiconductor device in which tubular contact elements can be mounted on an insulated circuit board with high positioning accuracy, and a mounting jig for mounting the tubular contact elements on the insulated circuit board.

SUMMARY OF THE INVENTION

For achieving the foregoing object, a method of manufacturing a semiconductor device is provided as follows.

In the method of the invention, a semiconductor device includes an insulated circuit board having a circuit pattern formed on at least one surface thereof, at least one semiconductor element mounted on the insulated circuit board, a plurality of tubular contact elements joined to the circuit pattern on the insulated circuit board, a plurality of external terminals electrically connected to the respective tubular contact elements, and a case containing the insulated circuit board. In the method, the plurality of tubular contact elements is joined onto the circuit pattern on the insulated circuit board. The method uses a mounting jig having an insulated circuit board positioning jig, a tubular contact element positioning jig having a plurality of positioning holes formed at predetermined positions to insert the tubular contact elements, and a tubular contact element press-down jig. By the insulated circuit board positioning jig and the tubular contact element positioning jig, an insulated circuit board and the tubular contact elements are positioned, and the tubular contact elements are soldered to the insulated circuit board while being pressed down by the tubular contact element press-down jig.

For achieving the foregoing object, a mounting jig as follows is provided.

The mounting jig is a jig having an insulated circuit board positioning jig holding the insulated circuit board at a predetermined position for positioning, a tubular contact element positioning jig having a plurality of positioning holes at predetermined positions to insert a tubular contact element, and a tubular contact element press-down jig for pressing down the plurality of tubular contact elements inserted into the respective positioning holes in the tubular contact element positioning jig.

According to the invention, an insulated circuit board and a plurality of tubular contact elements are positioned by an insulated circuit board positioning jig and a tubular contact element positioning jig, respectively, of a mounting jig, and the tubular contact elements are then soldered onto the insulated circuit board while being pressed down by a tubular contact element press-down jig, by which the tubular contact elements can be mounted on the insulated circuit board with high positioning accuracy.

BRIEF DESCRIPTION OF THE DRAWINGS

FIGS. 5(a)-5(c) are front views showing examples of the tubular contact element, wherein FIG. 5(a) shows the front view of the tubular contact element having top and bottom flanges; FIG. 5(b) shows the front view of the tubular contact element having the bottom flange; and FIG. 5(c) shows the tubular contact element having no flange.

FIGS. 6(a), 6(b) are elevation views illustrating the mounting jig according to an embodiment of the invention in which FIG. 6(a) shows a portion of the mounting jig in section according to the embodiment and FIG. 6(b) shows an exploded view partly in section.

FIGS. 11(a), 11(b) are elevation views illustrating the mounting jig according to another embodiment of the invention in which FIG. 11(a) shows a portion of the mounting jig in section according to the embodiment, and FIG. 11(b) shows an exploded view partly in section.

DESCRIPTION OF THE PREFERRED EMBODIMENT

An embodiment of each of a manufacturing method of a semiconductor device and a mounting jig according to the invention will be specifically explained with the drawings.

Figure 1:
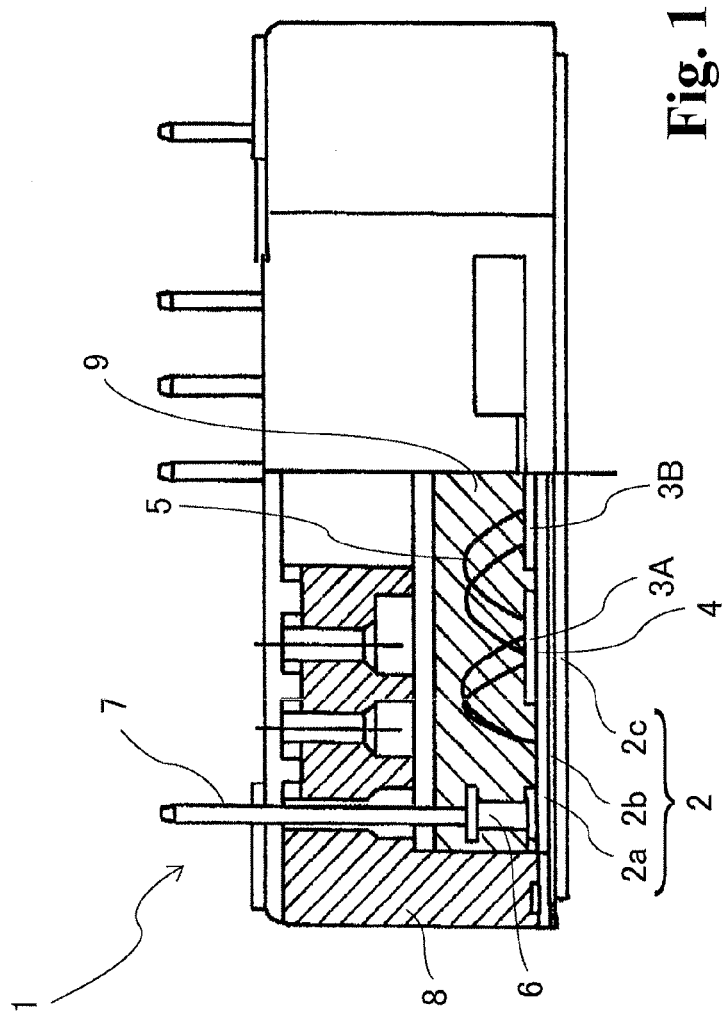
FIG. 1 is a front view partly in section showing a semiconductor module as an embodiment of a semiconductor device manufactured by a manufacturing method according to the invention.
Figure 2:
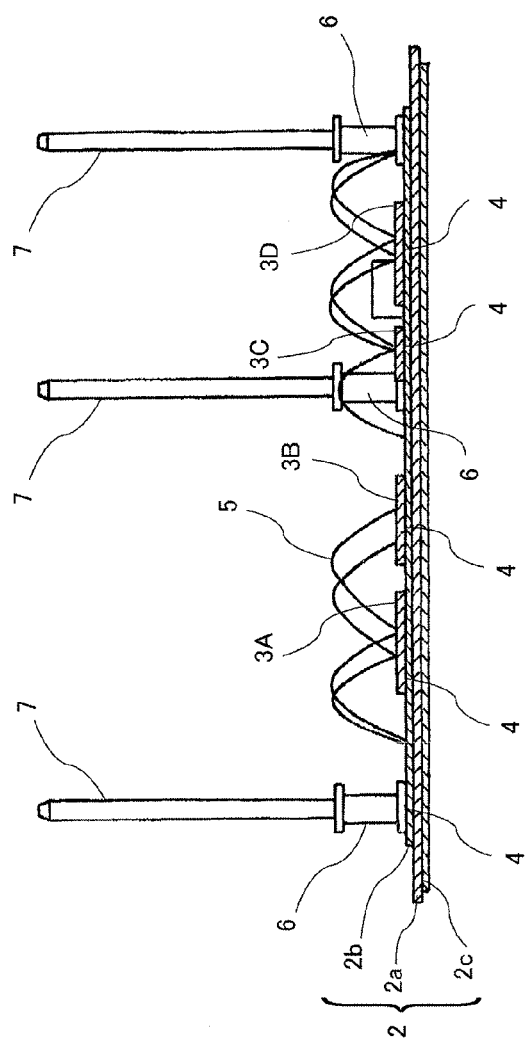
FIG. 2 is an enlarged cross-sectional view showing a principal part of the semiconductor module shown in FIG. 1.

FIG. 1 is a front view in which a part is in cross-sectional view showing a semiconductor module 1 as an embodiment of a semiconductor device manufactured by a manufacturing method according to the invention. FIG. 2 is an enlarged cross-sectional view showing a principal part of the semiconductor module 1 shown in FIG. 1.

The semiconductor module 1, as is shown in FIG. 1 and FIG. 2, has at least one semiconductor chip, four semiconductor chips 3A, 3B, 3C, and 3D in the illustrated embodiment, as semiconductor elements mounted on an insulated circuit board 2. The semiconductor chips 3A, 3B, 3C, and 3D can be, for example, IGBT (Insulated Gate Bipolar Transistor) chips and FWD (Free Wheeling Diode) chips. The insulated circuit board 2 is formed of an insulating substrate 2a, a conductor pattern layer 2b formed on one surface of the insulating substrate 2a and a metal layer 2c formed on the other surface of the insulating substrate 2a. The insulating substrate 2a is a substrate of insulating ceramic material such as aluminum oxide, aluminum nitride or silicon nitride. The conductor pattern layer 2b is a layer formed into a circuit pattern with a conductor foil such as a copper foil or an aluminum foil. The metal layer 2c is a layer of foil such as copper foil or aluminum foil.

The semiconductor chips 3A, 3B, 3C, and 3D are joined onto the conductor pattern layer 2b side of the insulated circuit board 2 with solder 4. By the solder 4 or by bonding wires 5 of metal such as aluminum, the semiconductor chips 3A, 3B, 3C, and 3D are electrically connected to the conductor pattern layer 2b.

Figure 3:
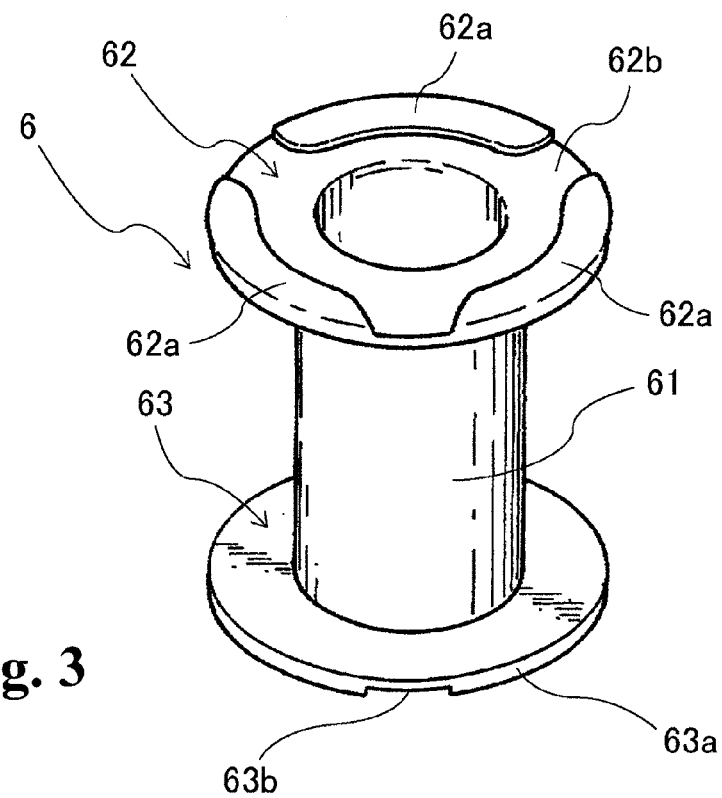
FIG. 3 is a perspective view showing a tubular contact element.

The semiconductor module 1 is provided with a plurality of tubular contact elements 6 on the conductor pattern layer 2b of the insulated circuit board 2. FIG. 3 is a perspective view showing a tubular contact element 6. The tubular contact elements 6 is made of conductive material, copper, for example, and is, as is shown in the perspective view of FIG. 3, formed into a shape having a top flange 62 at one longitudinal end to be the top end of a hollow cylindrical tube 61 as a tube and a bottom flange 63 at the other longitudinal end to be the bottom end. The top flange 62 has a plurality of thicker sections 62a formed along the periphery thereof and a thinner section 62b as a section other than the thicker sections 62a. In the same way, the bottom flange 63 has a plurality of thicker sections 63a and a thinner section 63b. The bottom flange 63, having thicker sections 63a, facilitates discharge of flux in soldering to permit reliable soldering. The top flange 62 and the bottom flange 63 are preferably formed in the same shapes. This, however, does not exclude them from being formed into shapes different from each other. One longitudinal end of the tubular contact element 6 is joined to the conductor pattern layer 2b of the insulated circuit board 2 with the solder 4 so that the tubular contact element 6 extends from the surface of the conductor pattern layer 2b of the insulated circuit board 2 with the longitudinal direction thereof being oriented in the vertical direction.

Figure 4:
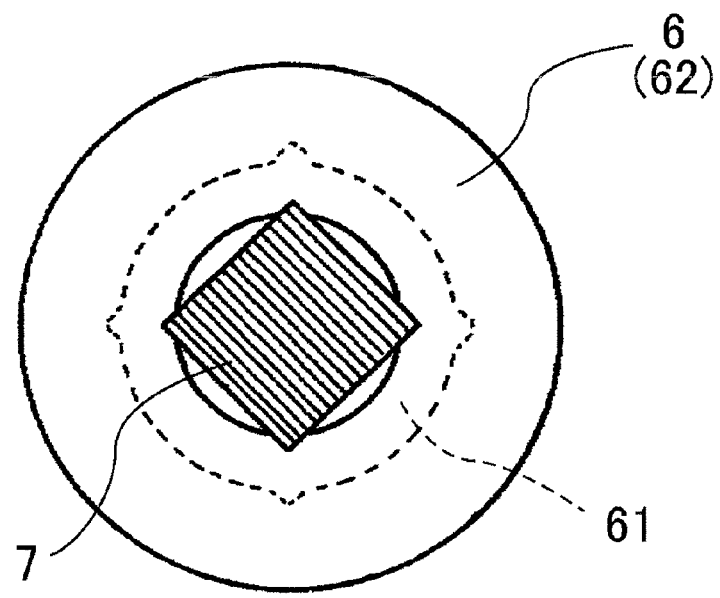
FIG. 4 is a schematic plan view showing the connection between the tubular contact element and the external terminal.

In the semiconductor module 1, into the inner space of each of the tubular contact elements 6, an external terminal 7 is inserted. The external terminal 7 has a cross-sectional form of a polygon, a square, for example, having diagonals each with a length a little larger than the inner diameter of the tubular contact element 6. FIG. 4 is a schematic plan view showing the connection between the tubular contact element 6 and the external terminal 7. As is shown in the schematic plan view of FIG. 4, by inserting the external terminal 7 into the tubular contact element 6 to be fixed thereto while making the tubular contact element 6 cause plastic deformation, in other word, by making the external terminal 7 press-fitted to the tubular contact element 6, the external terminal 7 can be connected to the tubular contact element 6 with a high degree of reliability.

The insulated circuit board 2, on which the semiconductor chips 3A, 3B, 3C, and 3D have been mounted, to which board the tubular contact elements 6 have been joined and in which board the bonding wires 5 have been wired, is contained in a case 8 (FIG. 1) and the bottom end of the case 8 is bonded to the periphery of the insulated circuit board 2. A space in apart inside the case 8 and lower than the upper lid thereof is filled with gel 9 by which the inside of the case 8 is sealed. One end of the external terminal 7 protrudes from the case 8.

Figure 5C:
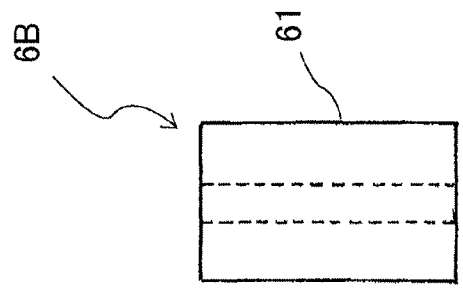
Figure 5B:
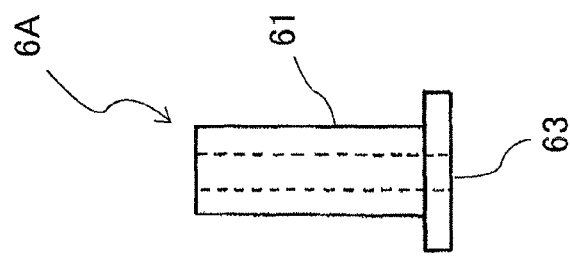
Figure 5A:
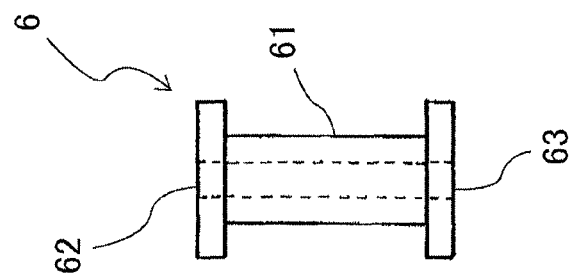

The tubular contact element 6 shown in FIG. 1 and FIG. 2 has a shape having the top flange 62 at one longitudinal end to be the top end of the hollow cylindrical tube 61 and the bottom flange 63 at the other longitudinal end to be the bottom end. The invention, however, is not limited to the shape. As is shown in FIGS. 5(a)-5(c), a front view showing examples of the tubular contact element 6, in addition to the tubular contact element 6 (FIG. 5(a)) having the top flange 62 at one longitudinal end to be the top end and the bottom flange 63 at the other longitudinal end to be the bottom end, the structure of a tubular contact element 6A (FIG. 5 (b)) having the bottom flange 63 at one longitudinal end to be the bottom end and that of a tubular contact element 6B (FIG. 5(c)) having no flange at either longitudinal end are also possible.

Figure 6A:
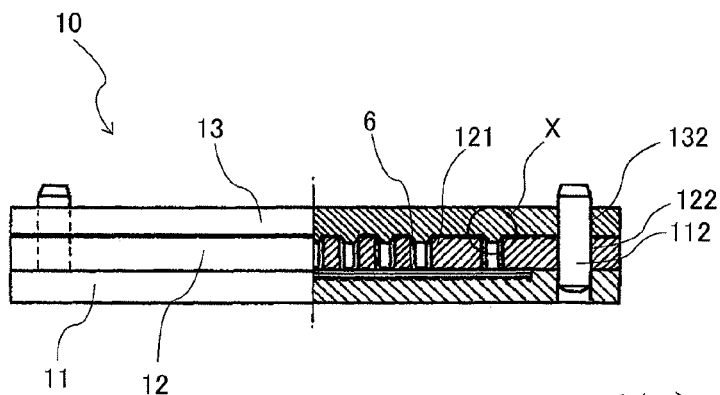
Figure 6B:
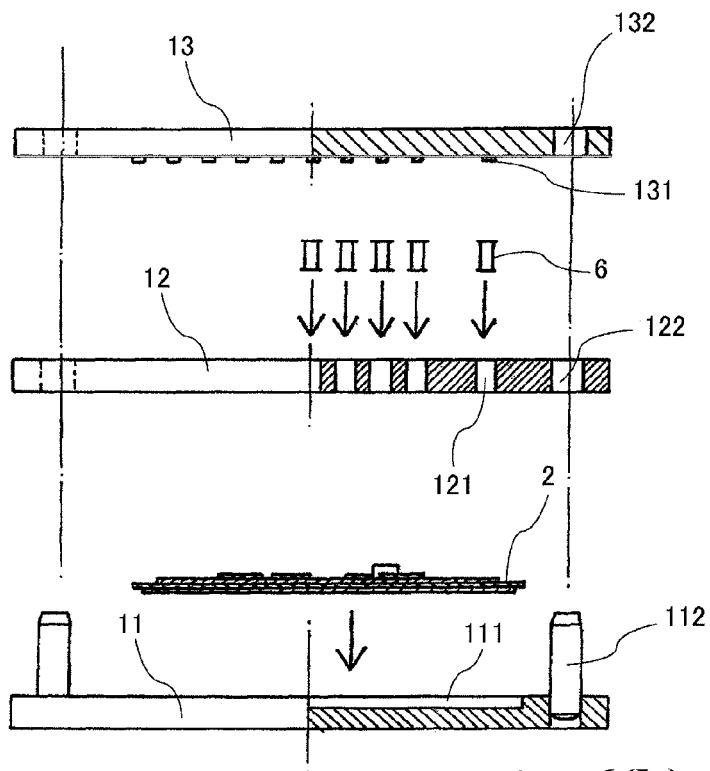

In the manufacturing process of the semiconductor module 1, when the tubular contact elements 6 are soldered to the insulated circuit board 2, a mounting jig 10 shown in FIGS. 6(a), 6(b) is used. FIGS. 6(a), 6(b) are elevation views illustrating the mounting jig 10 according to an embodiment of the invention in which FIG. 6(a) shows a portion of the mounting jig partly in section, and FIG. 6(b) shows an exploded view partly in section. The mounting jig 10 has an insulated circuit board positioning jig 11 for positioning the insulated circuit board 2, a tubular contact element positioning jig 12 arranged over the insulated circuit board positioning jig 11 for positioning the tubular contact elements 6 and a tubular contact element press-down jig 13 arranged over the tubular contact element positioning jig 12 for pressing-down the tubular contact elements 6.

Figure 7:
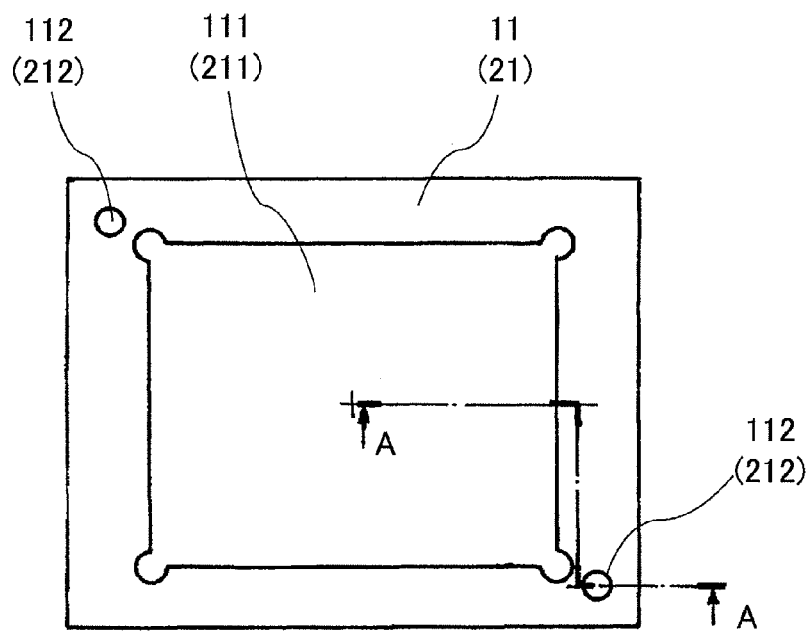
FIG. 7 is a plan view showing the insulated circuit board positioning jig.

FIG. 7 is a plan view showing the insulated circuit board positioning jig 11. The insulated circuit board positioning jig 11, as is shown in FIG. 7, has a recess 111 having a plane figure the same as that of the insulated circuit board 2. In the recess 111, the insulated circuit board 2 is held without substantially leaving any gap. Moreover, in the vicinity of each of the upper left corner and the lower right corner on the upper surface of the insulated circuit board positioning jig 11, a guide pin 112 of metal, of stainless steel, for example, is provided projecting therefrom. The partial cross section of the insulated circuit board positioning jig 11 shown in FIGS. 6(a), 6(b) is the cross section along the line A-A viewed from the direction indicated by arrows in FIG. 7.

Figure 8:
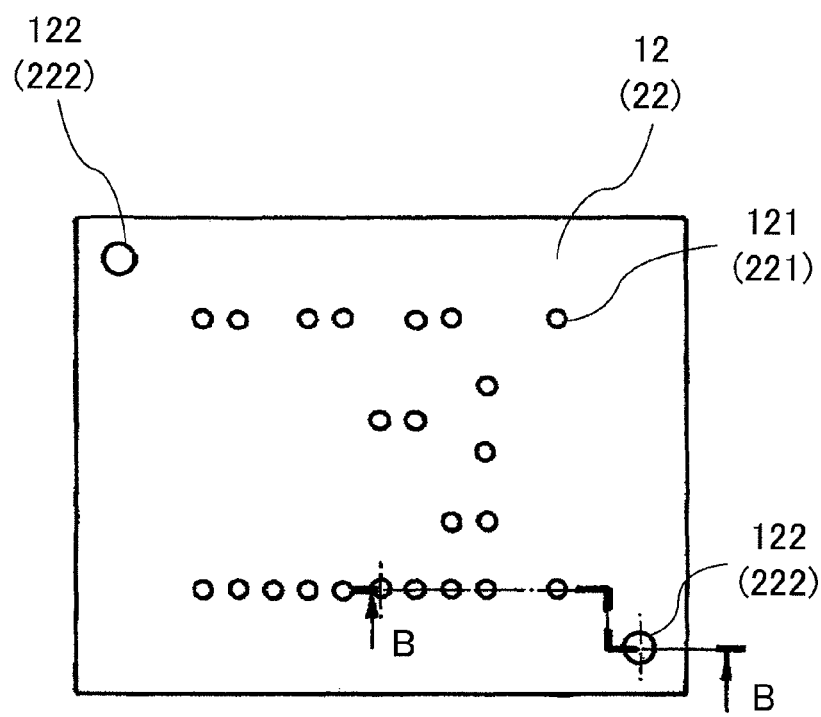
FIG. 8 is a plan view showing the tubular contact element positioning jig.

FIG. 8 is a plan view showing the tubular contact element positioning jig 12.

The tubular contact element positioning jig 12, as is shown in FIG. 8, has positioning holes 121 formed which penetrate the jig 12 in the thickness direction thereof each with a diameter permitting the tubular contact element 6 to be inserted. The positions of the positioning holes 121 are specified ones at which the tubular contact elements 6 are to be mounted on the insulated circuit board 2. The size of each of the positioning holes 121 is determined to be a little (for example, on the order of 0.15 mm) larger than the outer diameter of the tubular contact element 6, namely the outer diameter of the top flange 62 or the bottom flange 63 when the tubular contact element 6 has the top flange 62 and the bottom flange 63 or has only the bottom flange 63. This makes the ensured positioning accuracy and easiness in inserting the tubular contact element 6 compatible. The tubular contact element positioning jig 12 has a guide hole 122 formed in the vicinity of each of the upper left corner and the lower right corner. With the guide pin 112 inserted into each of the guide holes 122, the insulated circuit board 2 held in the insulated circuit board positioning jig 11 and the tubular contact elements 6 inserted into the positioning holes 121 in the tubular contact element positioning jig 12 are positioned. In the embodiment, the thickness of the tubular contact element positioning jig 12 is larger than the longitudinal length of the tubular contact element 6. The tubular contact element positioning jig 12 shown partial cross-sectional view in FIGS. 6(a), 6(b) is the cross section along the line B-B viewed from the direction indicated by arrows in FIG. 8.

Figure 9:
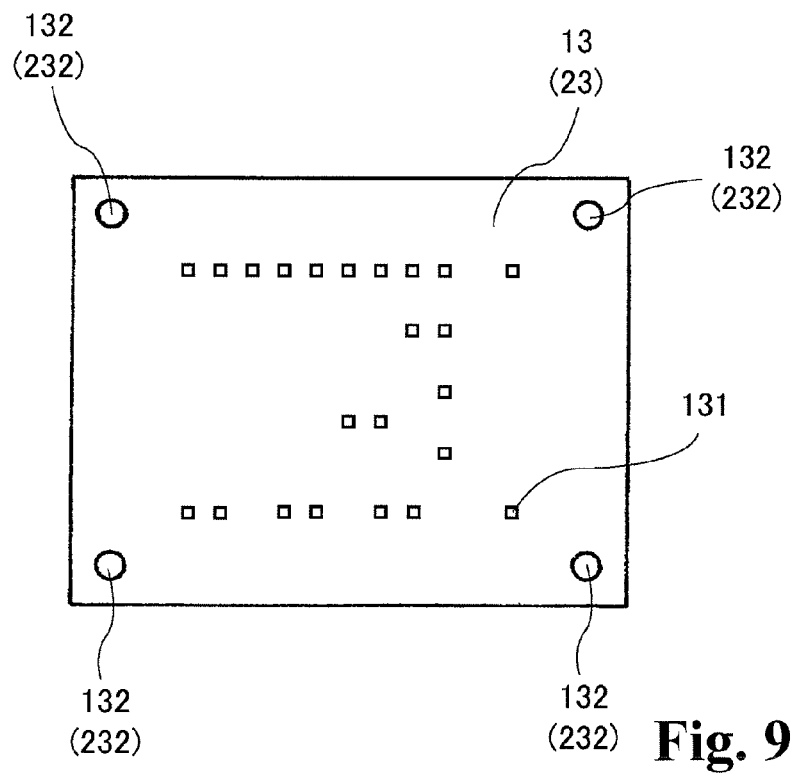
FIG. 9 is a view showing the tubular contact element press-down jig viewed from the back thereof.

FIG. 9 is a view showing the tubular contact element press-down jig 13 viewed from the back thereof. As is shown in FIG. 9, the tubular contact element press-down jig 13 has a plurality of projections 131 formed on the back thereof facing the tubular contact element positioning jig 12. The positions of the projections 131 are specified ones at which the projections 131 can press down the tubular contact elements 6 inserted into the tubular contact element positioning jig 12. The size of the projection 131 is determined to be the size with which the projection 131 can be inserted into the positioning hole 121 of the tubular contact element positioning jig 12 and can press down the tubular contact element 6 and, particularly when the tubular contact element 6 has the top flange 62, the thicker section 62a of the top flange 62. Therefore, the size of the projection 131 is preferably determined to be approximately equal to the outer diameter of the top flange 62. The shape of the projection 131 can be prism-shape or circular cylinder-shape. The projections 131 can be formed by cutting the back of the tubular contact element press-down jig 13 or also can be formed by press-fitting the projection 131 of metal into each of holes formed beforehand in the back of the tubular contact element press-down jig 13. When the projection 131 is made of metal, metallic material that cannot be joined by soldering such as stainless steel or aluminum is preferably used. The length of the projection 131 is determined to be the length with which the projection 131 can press down the tubular contact element 6 in the tubular contact element positioning jig 12 when the tubular contact element press-down jig 13 is laid on the tubular contact element positioning jig 12. The tubular contact element press-down jig 13 has guide hole 132 formed in the vicinity of each of four corners. By inserting the guide pin 112 into each of the guide holes 132, the tubular contact elements 6 inserted in the positioning holes 121 of the tubular contact element positioning jig 12 are made positioned so that the projections 131 of the tubular contact element press-down jig 13 can press down the tubular contact elements 6. The tubular contact element press-down jig 13 presses down the tubular contact elements 6 by its own weight.

Figure 15:
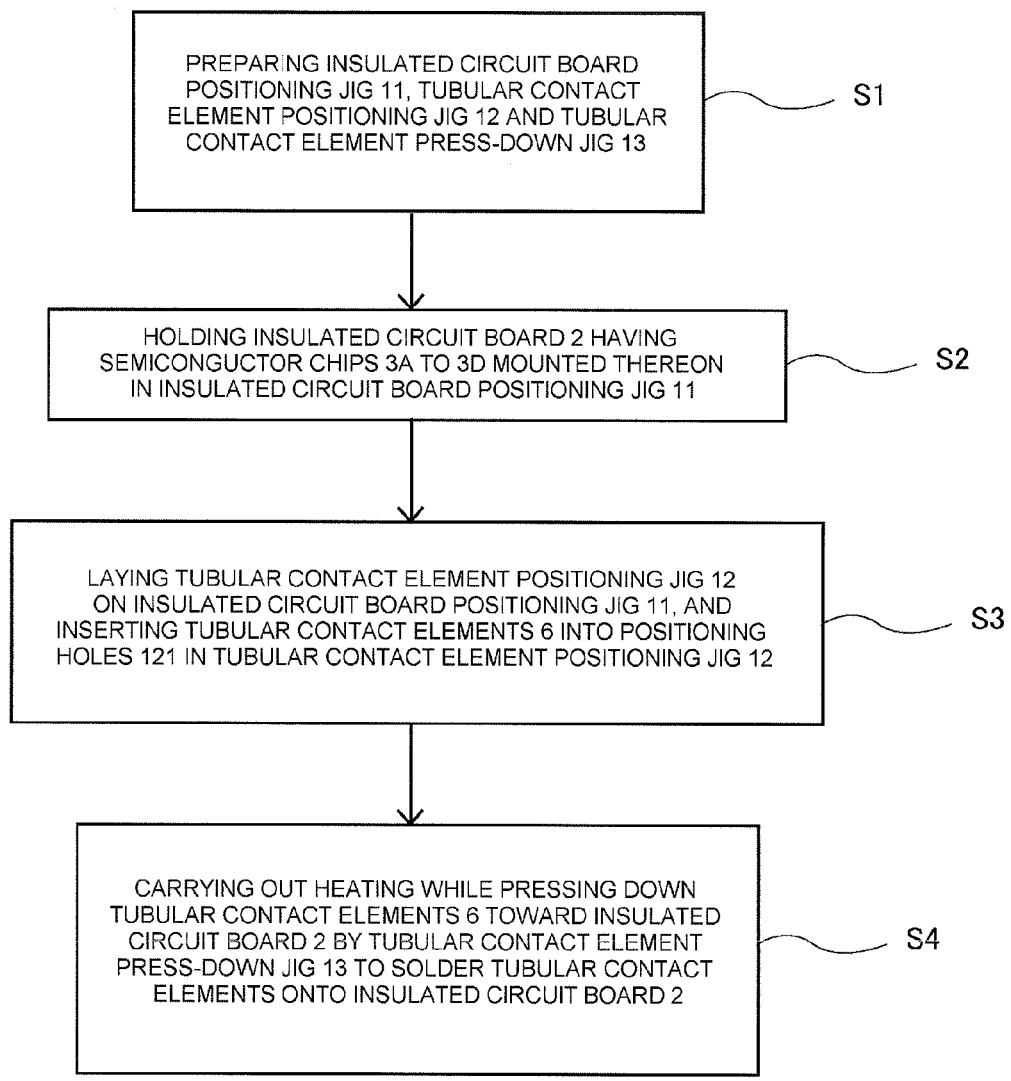
FIG. 15 is a flow chart showing a part of a joining process in a method of manufacturing a semiconductor device according to an embodiment of the invention.

An example of a method of soldering the tubular contact elements 6 to the insulated circuit board 2 with the use of the mounting jig 10 will be explained. FIG. 15 is a flow chart showing a part of a joining process in the method of manufacturing a semiconductor device according to an embodiment of the invention. First, the insulated circuit board positioning jig 11, the tubular contact element positioning jig 12 and the tubular contact element press-down jig 13 are prepared (step S1 in FIG. 15). Then, on the insulated circuit board 2, solder is applied at each of positions at which the tubular contact elements 6 are to be mounted and at each of positions at which the semiconductor chips 3A, 3B, 3C, and 3D are to be mounted. For the solder, solder paste is preferably used for being applied by printing. In the next, the semiconductor chips 3A, 3B, 3C, and 3D are placed on the conductor pattern layer 2b on the insulated circuit board 2 by using a device such as a mounter (automatic mounting device). Next to this, the insulated circuit board 2 is made to be held in the recess 111 of the insulated circuit board positioning jig 11 (step S2 in FIG. 15 (see FIG. 6(b)).

Following this, the tubular contact element positioning jig 12 is laid on the insulated circuit board positioning jig 11 by making the guide pins 112 thereof inserted through the guide holes 122 of the tubular contact element positioning jig 12. This determines the positions of the tubular contact elements 6 on the insulated circuit board 2. By using a device such as a mounter (automatic mounting device), the tubular contact elements 6 are inserted into the positioning holes 121 in the tubular contact element positioning jig 12 (step S3 in FIG. 15).

Subsequent to this, the tubular contact element press-down jig 13 is laid on the tubular contact element positioning jig 12 by making the guide pins 112 of the insulated circuit board positioning jig 11 inserted through the guide holes 132 of the tubular contact element press-down jig 13. This accomplishes the positioning of the tubular contact elements 6 in the positioning hole 121 of the tubular contact element positioning jig 12 and the projections 131 of the tubular contact element press-down jig 13, by which the tubular contact elements 6 are pressed down toward the insulated circuit board 2 (see FIG. 6(*a*)). With this state, the mounting jig 10, the insulated circuit board 2 and the tubular contact elements 6 are made contained in a depressurized furnace to be heated for melting solder, by which the tubular contact elements 6 are soldered onto the conductor pattern layer 2*b* on the insulated circuit board 2 (step S4 in FIG. 15). At the same time, the semiconductor chips 3A, 3B, 3C, and 3D are soldered onto the conductor pattern layer 2*b* on the insulated circuit board 2.

By the manufacturing method according to the one embodiment of the invention, the positioning carried out while pressing down the tubular contact elements 6 with the use of the mounting jig 10 enables the tubular contact elements 6 to be mounted on the insulated circuit board 2 with ensured verticality and high positional accuracy. Moreover, the positioning carried out while pressing down the tubular contact elements 6 with the use of the mounting jig 10 makes the tubular contact elements 6 vertically pressed against the insulated circuit board 2 at soldering, which allows solder to surely go into the hollow cylindrical tube 61 of each of the tubular contact elements 6 to thereby the amount of solder in the hollow cylindrical tube 61 can be reliably secured.

Figure 10:
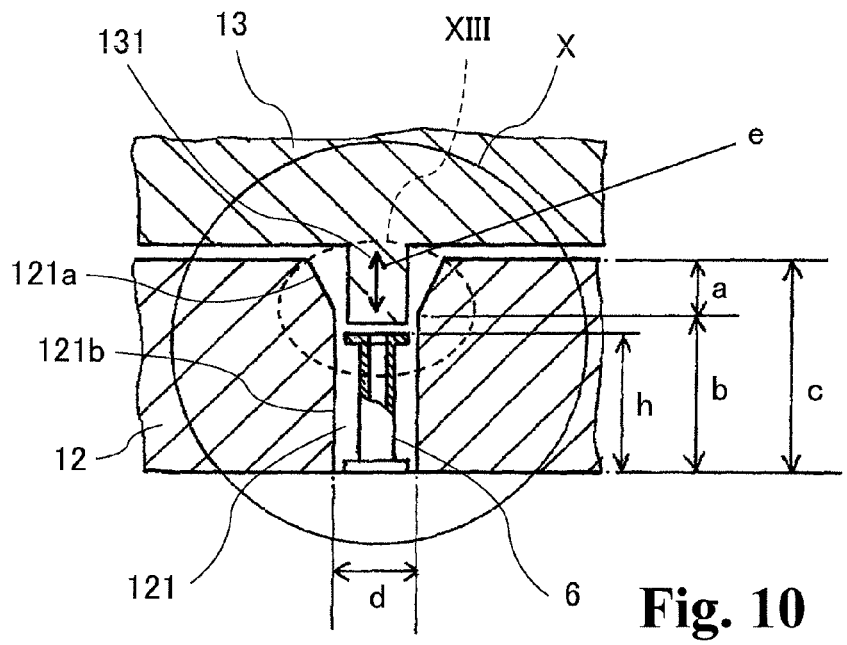
FIG. 10 is a partially enlarged cross-sectional view of the portion X in FIG. 6(a) as a portion in the vicinity of the positioning hole of the tubular contact element positioning jig.

For explaining the preferable form of the mounting jig 10, an enlarged fragmentary cross sectional view of the X portion in FIG. 6(*a*), namely a portion in the vicinity of the positioning hole 121 of the tubular contact element positioning jig 12, is shown in FIG. 10. The positioning hole 121 is formed of a tapered section 121*a* and a straight section 121*b*. In the tapered section 121*a*, the inner diameter of an opening on the side onto which the tubular contact element 6 is inserted is larger than the inner diameter of an opening on the opposite side and becomes smaller in the thickness direction. In the straight section 121*b*, the inner diameter of an opening is constant. The positioning hole 121, being formed so as to have the tapered section 121*a* on the side onto which the tubular contact element 6 is inserted, permits the tubular contact element 6 to be easily inserted into the positioning hole 121, by which workability can be improved.

As is shown in FIG. 10, in the positioning hole 121, letting the length from the surface on the side onto which the tubular contact element 6 is inserted to the bottom end of the tapered section 121*a*, that is, the length of the tapered section 121*a* in the thickness direction of the positioning hole 121 be a, the length from the bottom end of the tapered section 121*a* to the other surface of the tubular contact element positioning jig 12, that is, the length of the straight section 121*b* of the positioning hole 121 be b, the total length of the positioning hole 121, that is, the thickness of the tubular contact element positioning jig 12 be c and the inner diameter of the positioning hole 121 be d, and further letting the length of the projection 131 of the tubular contact element press-down jig 13 be e and the longitudinal length of the tubular contact element 6 be h, a structure in which the length b of the straight section 121*b* is made to be longer than the longitudinal length h of the tubular contact element 6 is a preferable form. The structure means that when the tubular contact element 6 is inserted into the positioning hole 121, the bottom end of the tapered section 121*a* of the positioning hole 121 positions higher than the top end of the tubular contact element 6, or means that the tubular contact element 6 is contained only in the straight section 121*b* without being contained in the tapered section 121*a*. The structure enables the tubular contact element press-down jig 13 to be easily removed from the tubular contact element positioning jig 12 after the tubular contact element 6 is soldered onto the conductor pattern layer 2*b* of the insulated circuit board 2.

Compared with this, when the length b of the straight section 121*b* is shorter than the longitudinal length of the tubular contact element 6, that is, when the bottom end of the tapered section 121*a* positions lower than the top end of the tubular contact element 6, in other words, when a part of the tubular contact element 6 is contained in the tapered section 121*a*, there is a possibility of lowering the verticality of the tubular contact element 6. Moreover, there is a possibility of causing the tubular contact element 6 to be caught by the bottom end of the tapered section 121*a* to thereby make the tubular contact element press-down jig 13 difficult to be easily removed from the tubular contact element positioning jig 12. Therefore, the foregoing structure is a particularly preferable form when using the tubular contact element 6 having the top flange 62 of the examples of the tubular contact elements 6 shown in FIG. 5(*a*).

A mounting jig 20 according to another embodiment of the invention will be explained by using FIGS. 11(*a*), 11(*b*). FIGS. 11(*a*), 11(*b*) are elevation views illustrating the mounting jig according to another embodiment of the invention in which FIG. 11(*a*) shows a portion of the mounting jig in section, and FIG. 11(*b*) shows an exploded view in which a portion of the mounting jig is in section. The mounting jig 20 shown in FIGS. 11(*a*), 11(*b*) has an insulated circuit board positioning jig 21 for positioning the insulated circuit board 2, a tubular contact element positioning jig 22 arranged over the insulated circuit board positioning jig 21 for positioning the tubular contact elements 6 and a tubular contact element press-down jig 23 arranged over the tubular contact element positioning jig 22 for pressing-down the tubular contact elements 6.

The insulated circuit board positioning jig 21 has a recess 211 and guide pins 212 having the same structures as those of the recess 111 and guide pins 112, respectively, explained in the foregoing when compared, although they have different reference numerals. Therefore, redundant explanations with respect to the recess 211 and guide pins 212 will be omitted. The partial cross section of the insulated circuit board positioning jig 21 shown in FIG. 11 is the cross section along the line A-A viewed from the direction indicated by arrows in FIG. 7.

Figure 11A:
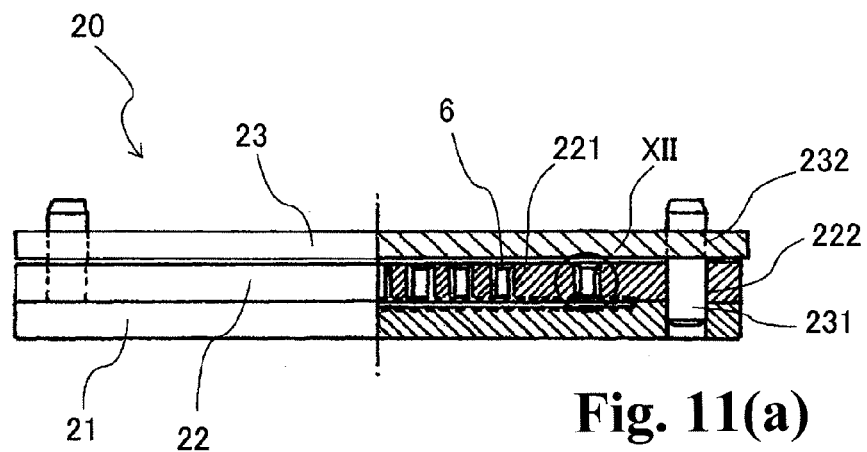
Figure 11B:
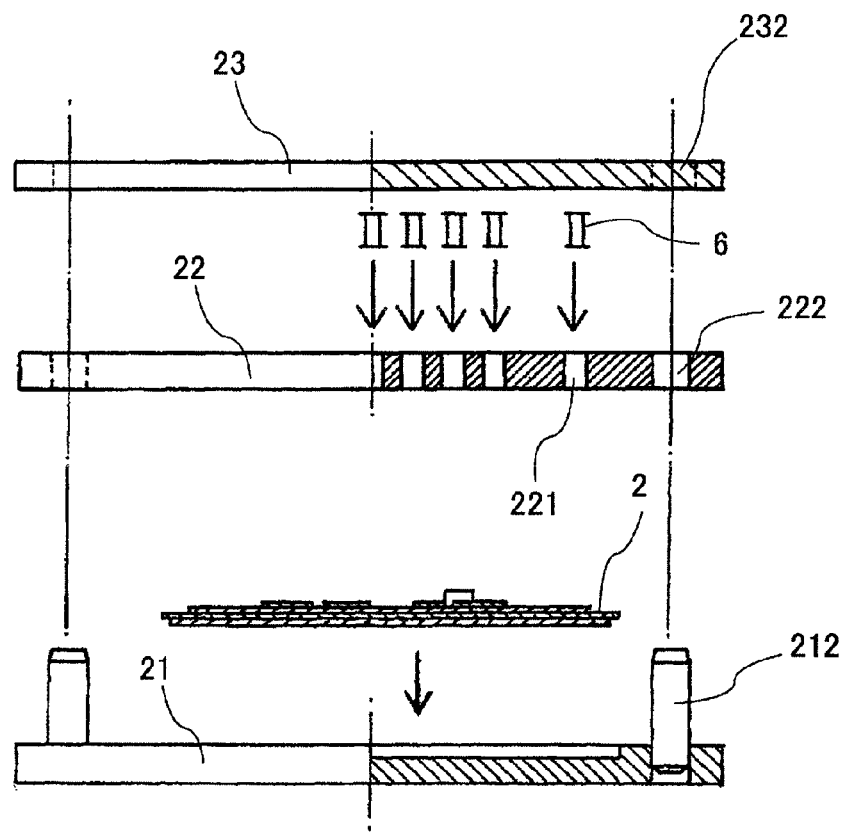

The tubular contact element positioning jig 22 has positioning holes 221 and guide holes 222 having the same structures as those of the positioning holes 121 and guide holes 122, respectively, explained in the foregoing when compared, although they have different reference numerals. Therefore, redundant explanations with respect to the positioning holes 221 and guide holes 222 will be omitted. The tubular contact element positioning jig 22 in the embodiment differs from the tubular contact element positioning jig 12 of the mounting jig 10 explained in the foregoing in that the thickness of the tubular contact element positioning jig 22 is smaller than the longitudinal length of the tubular contact element 6. From this, when the tubular contact element 6 is inserted in the positioning hole 221, the top end of the tubular contact element 6 is to project upward to be higher than the top surface of the tubular contact element positioning jig 22. The partial cross section of the tubular contact element positioning jig 22 shown in FIGS. 11(a), 11(b) is the cross section along the line B-B viewed from the direction indicated by arrows in FIG. 8.

The tubular contact element press-down jig 23 has guide holes 232 having the same structures as those of the guide holes 132 in the mounting jig 10 explained in the foregoing when compared, although they have different reference numerals. Therefore, redundant explanations with respect to the guide holes 232 will be omitted. In the illustrated embodiment, the tubular contact element press-down jig 23 has a flat bottom surface, that is, no projection is formed on the bottom surface. Therefore, the bottom surface of the tubular contact element press-down jig 23 has a shape without projections 131 shown in FIG. 9. However, like the tubular contact element press-down jig 13 in the mounting jig 10 explained in the foregoing, projections can be formed on the bottom surface of the tubular contact element press-down jig 23. The tubular contact element press-down jig 23 presses down the tubular contact elements 6 projecting upward higher than the top surface of the tubular contact element positioning jig 22 with the flat bottom surface of the tubular contact element press-down jig 23 by its own weight.

An example of a method of soldering the tubular contact elements 6 to the insulated circuit board 2 with the use of the mounting jig 20 can be made to be the same as the one example of the method of soldering the tubular contact elements 6 to the insulated circuit board 2 with the use of the mounting jig 10. Therefore, redundant explanations thereof will be omitted.

According to the manufacturing method of a semiconductor device using the mounting jig 20, the positioning carried out while pressing down the tubular contact elements 6 with the use of the mounting jig 20 enables the tubular contact elements 6 to be mounted on the insulated circuit board 2 with ensured verticality and high positional accuracy. Moreover, the positioning carried out while pressing down the tubular contact elements 6 with the use of the mounting jig 20 makes the tubular contact elements 6 vertically pressed against the insulated circuit board 2 at soldering, which allows solder to surely go into the hollow cylindrical tube 61 of each of the tubular contact elements 6 to thereby the amount of solder in the hollow cylindrical tube 61 can be reliably secured.

Figure 12:
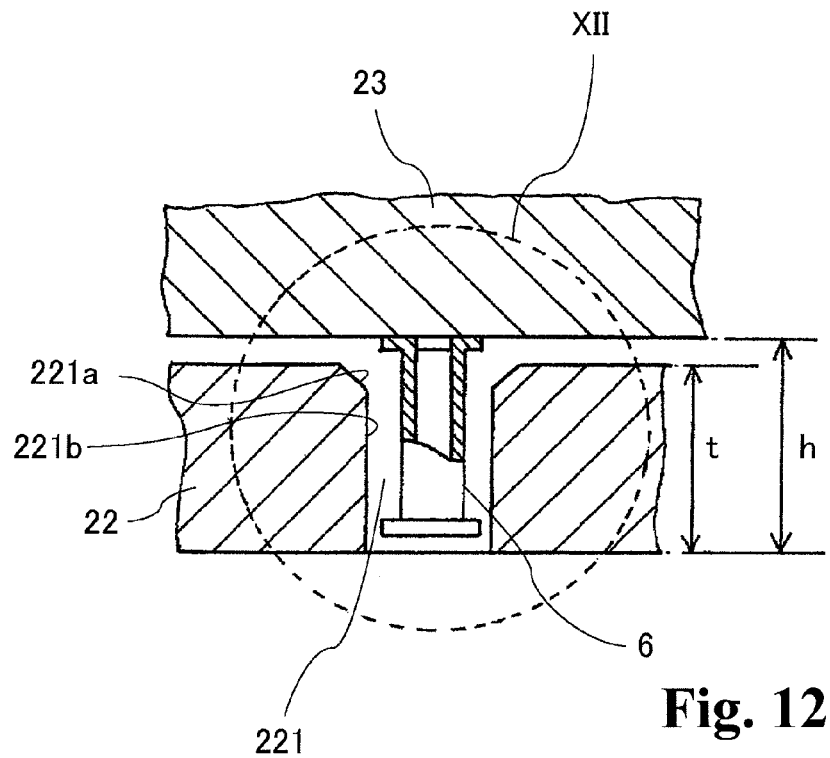
FIG. 12 is a partially enlarged cross-sectional view of the portion XII in FIG. 11(a) as a portion in the vicinity of the positioning hole of the tubular contact element positioning jig according to another embodiment of the invention.

For explaining the preferable form of the mounting jig 20, an enlarged fragmentary cross sectional view of the portion XII in FIG. 11(a), namely a portion in the vicinity of the positioning hole 221 of the tubular contact element positioning jig 22, is shown in FIG. 12. The positioning hole 221 is formed of a tapered section 221a and a straight section 221b. In the tapered section 221a, the inner diameter of an opening on the side onto which the tubular contact element 6 is inserted is larger than the inner diameter of an opening on the opposite side and becomes smaller in the thickness direction. In the straight section 221b, the inner diameter of an opening is constant. The positioning hole 221, being formed so as to have the tapered section 121a on the side onto which the tubular contact element 6 is inserted, permits the tubular contact element 6 to be easily inserted into the positioning hole 221, by which workability can be improved.

As is shown in FIG. 12, in another embodiment of the invention, a structure is provided in which letting the thickness of the tubular contact element positioning jig 22 be t and the longitudinal length of the tubular contact element 6 be h, the longitudinal length h of the tubular contact element 6 is longer than the thickness t of the tubular contact element positioning jig 22. For example, the difference between h and t is 0.3 mm or more. The structure is provided so that the tubular contact element press-down jig 23 can press down the tubular contact element 6. The foregoing structure can be applied to the case of using the tubular contact element 6 having the top flange 62 and to the cases of using the tubular contact elements 6A and 6B both having no top flanges 62.

Figure 13:
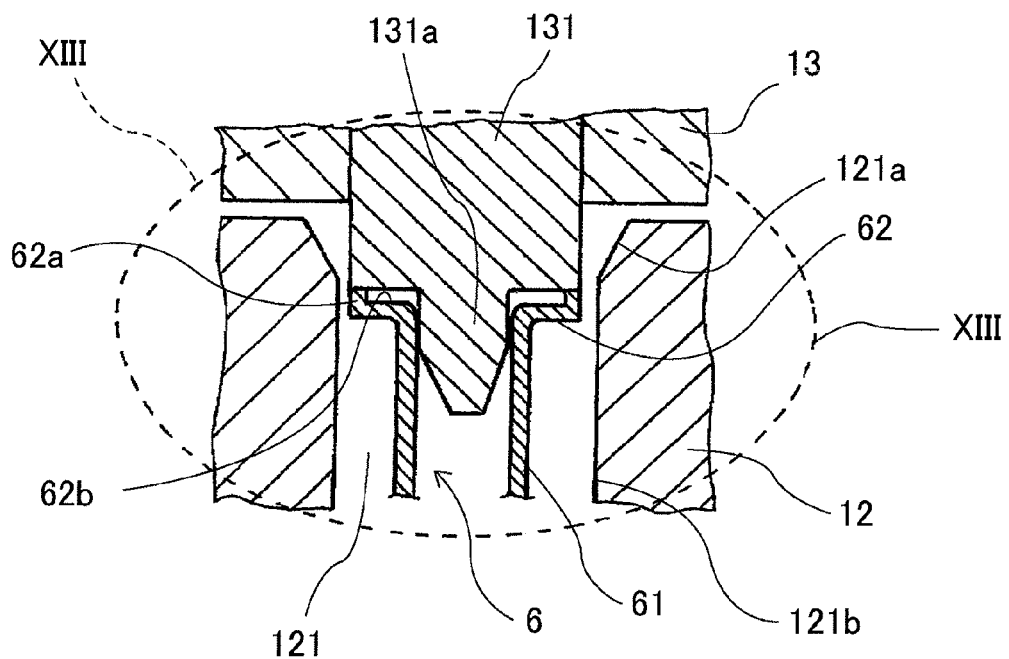
FIG. 13 is a partially enlarged cross-sectional view of the portion XIII in FIG. 10 as a portion in the vicinity of the projection formed in the tubular contact element press-down jig.

For explaining the preferable forms of the mounting jigs 10 and 20, a partially enlarged cross-sectional view of the portion XIII in FIG. 10, namely a portion in the vicinity of the projection 131 formed in the tubular contact element press-down jig 13 of the mounting jig 10, is shown in FIG. 13. As is shown in FIG. 13, a small projection 131a is formed at the head of the projection 131. The tip of the small projection 131a has a tapered down shape, by which the small projection 131a is made to be easily inserted in the hollow cylindrical tube 61 of the tubular contact element 6. Moreover, the base of the small projection 131a has an outer diameter smaller than the inner diameter of the hollow cylindrical tube 61 of the tubular contact element 6, by which the small projection 131a goes into the hollow cylindrical tube 61 of the tubular contact element 6 when the projection 131 presses down the tubular contact element 6. From this, it becomes possible to carry out positioning while pressing down the tubular contact element 6 with the use of the tubular contact element press-down jig 13 having the small projection 131a to thereby make it possible to further improve the positioning accuracy of the tubular contact element 6. In addition, the small projection 131a has a function of the upper lid of the hollow cylindrical tube 61 of the tubular contact element 6. This can prevent molten solder from running out together with flux from the longitudinal top end of the tubular contact element 6 through the hollow cylindrical tube 61 at soldering of the tubular contact element 6 in a depressurized furnace.

In FIG. 13, an example is shown in which the small projection 131a is formed in the tubular contact element press-down jig 13 of the mounting jig 10. However, also in the mounting jig 20, a small projection going into the hollow cylindrical tube 61 of the tubular contact element 6 can be formed in the tubular contact element press-down jig 23. Hence, only a small projection can be also formed on the flat bottom surface of the tubular contact element press-down jig 23. Moreover, it is also possible that a projection like the projection 131 formed in the tubular contact element press-down jig 13 is provided on the bottom surface of the tubular contact element press-down jig 23 and a small projection is provided at the head of the projection for being formed into a shape like the shape of the small projection 131a shown in FIG. 13. In either shape, it becomes possible for the mounting jig 20 to carry out positioning while pressing down the tubular contact elements 6 to thereby make it possible to further improve the positioning accuracy of the tubular contact element 6.

Figure 14:
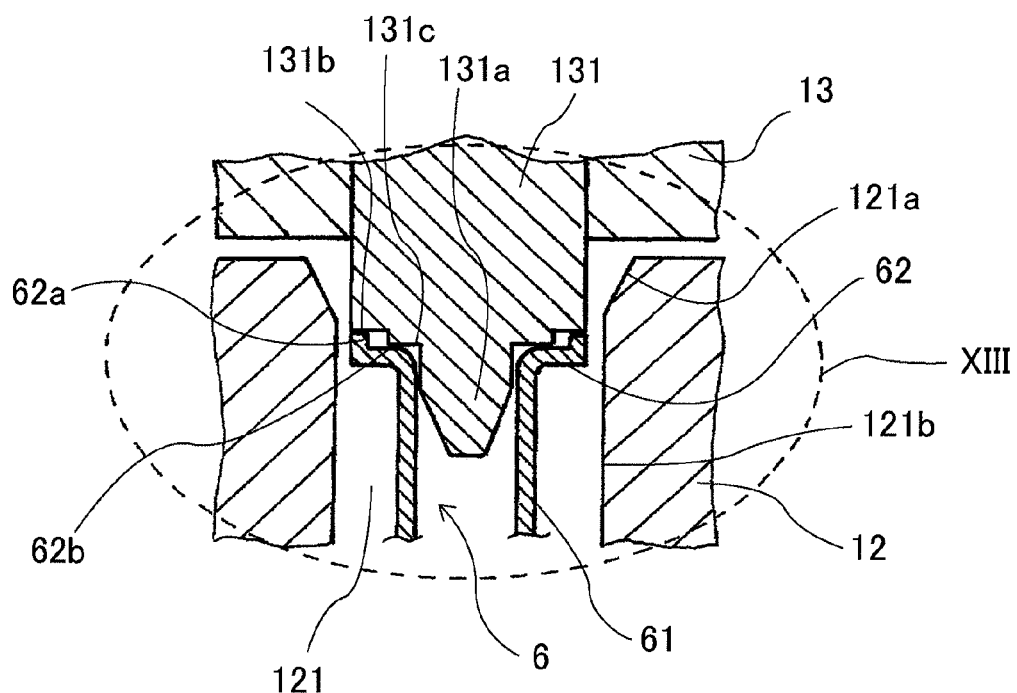
FIG. 14 is a schematic partially enlarged cross-sectional view of the portion XIII in FIG. 10 as a portion in the vicinity of the projection, the view showing an example of a modification of the tubular contact element press-down jig in which the small projections are formed.

FIG. 14 is a schematic partially enlarged cross-sectional view of the portion XIII in FIG. 10 as a portion in the vicinity of the projection 131, the view showing an example of a modification of the tubular contact element press-down jig 13 in which the small projections 131a are formed. The small projection 131a is formed at the head of the projection 131 shown in FIG. 14 and an outer peripheral section 131b and an inside peripheral section 131c at the head of the projection 131 are formed in step-like with a difference in level equal to the difference in thickness between the thicker section 62a and the thinner section 62b in the top flange 62 of the tubular contact element 6. The outer peripheral section 131b and the inside peripheral section 131c at the head of the projection 131 being formed in step-like, the outer peripheral section 131b and the inside peripheral section 131c can contact the thicker section 62a and the thinner section 62b, respectively, in the top flange 62 of the tubular contact element 6. Therefore, at soldering of the tubular contact element 6 in a depressurized furnace, molten solder is prevented from running out together with flux from the longitudinal top end of the tubular contact element 6 through the hollow cylindrical tube 61.

The insulated circuit board positioning jig 11, the tubular contact element positioning jig 12 and the tubular contact element press-down jig 13 forming the mounting jig 10 are preferably made of composite ceramic material having a coefficient of linear expansion equal to or less than the coefficient of linear expansion of carbon or carbon. Similarly, the insulated circuit board positioning jig 21, the tubular contact element positioning jig 22 and the tubular contact element press-down jig 23 forming the mounting jig 20 are preferably made of composite ceramic material having a coefficient of linear expansion equal to or less than the coefficient of linear expansion of carbon or carbon. When the jig forming the mounting jig 10 or the mounting jig 20 is formed with material having a coefficient of linear expansion larger than the coefficient of linear expansion of carbon, for example, metallic material such as aluminum, aluminum alloy or stainless steel, there is fear that a dimensional difference is caused between the jig and the insulated circuit board 2 due to a large difference between the coefficient of linear expansion of the jig and the coefficient of linear expansion of the insulated circuit board 2 to result in insufficient positioning accuracy of the tubular contact element 6 and therefore insufficient positioning accuracy of the external terminal 7. Therefore, by providing the jig forming the mounting jig 10 or the mounting jig 20 as a jig made of composite ceramic material having a coefficient of linear expansion equal to or less than the coefficient of linear expansion of carbon or carbon, the difference between the coefficient of linear expansion of the jig and the coefficient of linear expansion of the insulated circuit board 2 is made small to make it possible to ensure the positioning accuracy of the tubular contact element 6 to finally secure the positioning accuracy of the external terminal 7.

The insulated circuit board positioning jig 11, the tubular contact element positioning jig 12 and the tubular contact element press-down jig 13 forming the mounting jig 10, when made of composite ceramic material having a coefficient of linear expansion equal to or less than the coefficient of linear expansion of carbon or carbon, are not required to have their material unified to the same material. Thus, different materials can be combined for being used. The same is true for the mounting jig 20.

Moreover, when the material forming the mounting jig 10 or the mounting jig 20 is chosen to be composite ceramic material having a coefficient of linear expansion equal to or less than the coefficient of linear expansion of carbon or carbon, it is preferable from the view point of easiness in processing the jig that the material can be subjected to cutting. For the composite ceramic material that has a coefficient of linear expansion equal to or less than the coefficient of linear expansion of carbon and can be subjected to cutting, there are silicon nitride series composite ceramics, alumina series composite ceramics and boron nitride series composite ceramics. For example, there are named ceramics such as $Si_3N_4$—BN composite ceramic, $Al_2O_3$—BN composite ceramic and hBN ceramic.

In the manufacturing process of the semiconductor module 1, after the tubular contact elements 6 are positioned onto the insulated circuit board 2 by using the mounting jig 10 or the mounting jig 20 to be soldered to the insulated circuit board 2, specified wire bonding work is carried out with respect to the insulated circuit board 2. Then, the external terminal 7 is inserted into each of the tubular contact elements 6 to be press-fitted thereto for electrical connection. After this, to the insulated circuit board 2, the case 8 is bonded, which is then filled with the gel 9.

In the foregoing, the manufacturing method of a semiconductor device and the mounting jig according to the invention were specifically explained by the embodiments with reference to the attached drawings. The manufacturing method of a semiconductor device and the mounting jig according to the invention, however, are not limited to those described as the embodiments and shown in the attached drawings, but various modifications are possible.

While the present invention has been particularly shown and described with reference to the preferred embodiment thereof, it will be understood by those skilled in the art that the foregoing and other changes in form and details can be made therein without departing from the spirit and scope of the present invention.

What is claimed is:

1. A mounting jig for a semiconductor device, comprising:
    an insulated circuit board-positioning jig positioning an insulated circuit board by housing the insulated circuit board at a predetermined position,
    a tubular contact element positioning jig having a plurality of positioning holes at predetermined positions to insert a plurality of tubular contact elements respectively, and
    a tubular contact element press-down jig for pressing down the plurality of tubular contact elements inserted into the respective positioning holes in the tubular contact element positioning jig,
    wherein the tubular contact element press-down jig includes a plurality of projections insertable into each of the plurality of positioning holes.

2. The mounting jig according to claim 1, wherein each of the plurality of positioning holes of the tubular contact element positioning jig has a tapered section at an opening section on a side to insert the tubular contact element.

3. The mounting jig according to claim 2, wherein the tubular contact element positioning jig has a thickness greater than a longitudinal length of the tubular contact element and a bottom end of the tapered section of each of the positioning holes is disposed higher than a top end of the tubular contact element.

4. The mounting jig according to claim 2, wherein the tubular contact element positioning jig has a thickness less than a longitudinal length of the tubular contact element.

5. The mounting jig according to claim 1, wherein the tubular contact element press-down jig includes the plurality of projections insertable into a tube of each of the tubular contact elements.

6. The mounting jig according to claim 1, wherein the mounting jig is made of at least one material selected from the group consisting of composite ceramics having a coefficient of linear expansion equal to or less than a coefficient of linear expansion of carbon, and carbon.

7. The mounting jig according to claim 1, wherein the tubular contact element is a single tube.

8. A mounting jig for a semiconductor device, comprising:
an insulated circuit board-positioning jig positioning an insulated circuit board by housing the insulated circuit board at a predetermined position,
a tubular contact element positioning jig having a plurality of positioning holes at predetermined positions to insert a plurality of tubular contact elements respectively, and
a tubular contact element press-down jig for pressing down the plurality of tubular contact elements inserted into the respective positioning holes in the tubular contact element positioning jig,
wherein each of the tubular contact elements includes a flange at least at one of a longitudinal top end or a longitudinal bottom end thereof.

* * * * *

UNITED STATES PATENT AND TRADEMARK OFFICE
CERTIFICATE OF CORRECTION

PATENT NO. : 9,877,397 B2  
APPLICATION NO. : 14/923941  
DATED : January 23, 2018  
INVENTOR(S) : Rikihiro Maruyama et al.

Page 1 of 1

It is certified that error appears in the above-identified patent and that said Letters Patent is hereby corrected as shown below:

In the Specification

Please change Column 4, Line 26, from "... same shapes . ..." to --... same shapes. ...--.

Please change Column 4, Line 56, from "A space in apart ..." to --A space in a part ...--.

Signed and Sealed this  
Thirty-first Day of July, 2018

Andrei Iancu  
*Director of the United States Patent and Trademark Office*